(12) United States Patent
Yang et al.

(10) Patent No.: US 12,249,959 B1
(45) Date of Patent: Mar. 11, 2025

(54) VOLTAGE-CONTROLLED OSCILLATOR WITH TUNABLE TAIL HARMONIC FILTER

(71) Applicant: GlobalFoundries U.S. Inc., Malta, NY (US)

(72) Inventors: Qiao Yang, Shanghai (CN); Chi Zhang, Allen, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/484,504

(22) Filed: Oct. 11, 2023

(51) Int. Cl.
  *H03B 5/12* (2006.01)
  *H03B 5/04* (2006.01)
  *H03B 5/36* (2006.01)

(52) U.S. Cl.
  CPC ............. *H03B 5/368* (2013.01); *H03B 5/04* (2013.01); *H03B 5/1215* (2013.01); *H03B 5/1218* (2013.01); *H03B 5/1228* (2013.01); *H03B 5/1253* (2013.01); *H03B 5/1284* (2013.01); *H03B 5/129* (2013.01); *H03B 2201/0208* (2013.01)

(58) Field of Classification Search
  CPC .. H03B 5/1228; H03B 5/1215; H03B 5/1212; H03B 5/1243; H03B 2200/0054; H03B 5/1284; H03B 5/129
  See application file for complete search history.

(56) References Cited

U.S. PATENT DOCUMENTS

| 8,350,634 | B2 | 1/2013 | Luich | |
| 10,498,290 | B2* | 12/2019 | Issakov | H03B 5/1243 |
| 2003/0227336 | A1* | 12/2003 | Wang | H03B 5/1253 |
| | | | | 331/100 |
| 2006/0097798 | A1* | 5/2006 | Cojocaru | H03B 5/1253 |
| | | | | 331/36 C |

(Continued)

OTHER PUBLICATIONS

Wang, Xinyi, et al. "2.4-GHz-band low-voltage LC-VCO IC with simplified noise filtering in 180-nm CMOS." 2016 IEEE MTT-S International Wireless Symposium (IWS). IEEE, 2016. (Year: 2016).*

(Continued)

*Primary Examiner* — Ryan Johnson
(74) *Attorney, Agent, or Firm* — David Cain; Hoffman Warnick LLC (57) ABSTRACT

Disclosed is a voltage-controlled oscillator (VCO) including at least an inductor-capacitor (LC) resonant circuit (including varactors that receive a variable input voltage), cross-coupled transistors connected to the LC resonant circuit, and an LC filter connected to a shared source node of the cross-coupled transistors. The cross-coupled transistors can have back gates connected to receive a variable back gate bias voltage (Vbg), which is dependent on Vin to ensure that an optimal relationship between the oscillating frequency ($\omega_0$) of the LC resonant circuit and the resonant frequency ($\omega_1$) of the LC filter is continuously maintained to minimize phase noise. For example, if Vin is increased to increase varactor capacitance and, thereby decrease $\omega_0$, then Vbg is also increased, thereby increasing the voltage (Vs-s) and the (Continued)

capacitance (Cs-s) on the shared source node connected to the LC filter, decreasing $\omega_1$, and maintaining an optimal relationship of $\omega_0=\omega_1/2$.

20 Claims, 6 Drawing Sheets (56) References Cited

U.S. PATENT DOCUMENTS

| | | | |
|---|---|---|---|
| 2007/0080754 A1 | 4/2007 | Park et al. | |
| 2008/0266005 A1* | 10/2008 | Jacobsson | H03B 5/124 331/108 A |
| 2014/0139295 A1 | 5/2014 | Sun et al. | |
| 2019/0089302 A1* | 3/2019 | Moslehi Bajestan | H03B 5/1268 |

OTHER PUBLICATIONS

Garampazzi et al., "Analysis and Design of a 195.6 dBc/Hz Peak FoM P-N Class-B Oscillator With Transformer-Based Tail Filtering," IEEE Journal of Solid-State Circuits, vol. 50, No. 7, Jul. 2015, 12 pages.

Hegazi et al., "A Filtering Technique to Lower Oscillator Phase Noise," ISSCC 2001, Session 23, Analog Techniques, 23.4, IEEE Journal of Solid-State Circuits, 36(12), 3 pages.

Staszewski et al., "A First Muligigahertz Digitally Controlled Oscillator for Wireless Applications," IEEE Transactions on Mircowave Theory and Techniques, vol. 51, No. 11, Nov. 2003, 12 pages.

Yang et al., "A 0.6 V 10 GHz CMOS VCO Using a Negative-Gm Back-Gate Tuned Technique," IEEE Microwave and Wireless Components Letters, vol. 21, No. 3, Mar. 2011, 3 pages.

\* cited by examiner

VOLTAGE-CONTROLLED OSCILLATOR WITH TUNABLE TAIL HARMONIC FILTER

BACKGROUND

The present disclosure relates voltage-controlled oscillators and, particularly, to embodiments of a voltage-controlled oscillator including a tunable tail harmonic filter.

Voltage-controlled oscillators (VCOs) generate an oscillating output signal at a frequency proportional to an input voltage signal (Vin). Typically, a VCO includes an inductor-capacitor (LC) resonant circuit (also referred to herein as an LC tank) to generate the oscillating output signal at a particular oscillating frequency. The VCO also include at least one pair of cross-coupled transistors connected to the LC resonant circuit to compensate for energy loss and an LC filter (also referred to herein as a tail harmonic filter) connected to a shared source node of the transistors to reduce phase noise. Additional circuitry is typically required to enable fine tuning of the LC filter (e.g., to compensate for changes in Vin that lead to increased phase noise).

SUMMARY

Disclosed herein are embodiments of a structure (e.g., a voltage-controlled oscillator (VCO). The structure can include an inductor-capacitor resonant circuit having varactors connected to a voltage input node. This voltage input node can be connected to receive a variable input voltage. The structure can further include cross-coupled field effect transistors connected to the inductor-capacitor resonant circuit. These cross-coupled field effect transistors can have a shared source node and can further have back gates connected to receive a variable back gate bias voltage that is dependent on the variable input voltage. The structure can further include an inductor-capacitor filter connected to the shared source node.

Some embodiments of the structure disclosed herein can include an inductor-capacitor resonant circuit with varactors connected to a voltage input node. The varactors can include two n-type metal oxide semiconductor field effect transistor varactors and the voltage input node can be connected to receive a variable input voltage. The structure can further include cross-coupled p-type field effect transistors connected to the inductor-capacitor resonant circuit. The cross-coupled p-type field effect transistors can have a shared source node and can further have back gates connected to receive a variable back gate bias voltage that is dependent on the variable input voltage. The structure can further include an inductor-capacitor filter connected to the shared source node.

Some embodiments of the structure disclosed herein can include an inductor-capacitor resonant circuit with varactors connected to a voltage input node. The voltage input node can be connected to receive a variable input voltage. The structure can further include cross-coupled p-type field effect transistors connected to the inductor-capacitor resonant circuit. The cross-coupled p-type field effect transistors can have a first shared source node and can further have first back gates connected to receive a variable first back gate bias voltage that is dependent on the variable input voltage. The structure can further include a first inductor-capacitor filter connected between the first shared source node and a positive supply voltage. The structure can further include cross-coupled n-type field effect transistors connected to the inductor-capacitor resonant circuit. The cross-coupled n-type field effect transistors can have a second shared source node and can further have second back gates connected to receive a variable second back gate bias voltage that is dependent on the variable input voltage. The structure can further include a second inductor-capacitor filter connected between the second shared source node and ground.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

As mentioned above, VCOs generate an oscillating output signal at a frequency proportional to an input voltage signal (Vin). Typically, a VCO includes LC resonant circuit (also referred to herein as an LC tank). Energy stored in the LC resonant circuit alternates at a resonant frequency between electrical energy stored in capacitor(s) and magnetic energy stored in inductor(s) to generate the oscillating output signal with a particular oscillating frequency ($\omega_0$). Such a VCO can also include at least one pair of cross-coupled transistors connected to the LC resonant circuit to compensate for energy loss. Additionally, a VCO can include an LC filter (also referred to herein as a tail harmonic filter), which is connected to a shared source node of the cross-coupled transistors and which is designed to have a resonant frequency ($\omega_1$) equal to twice $\omega_0$ in order to eliminate return paths for the second harmonic ($2\omega_0$) and thereby eliminate common mode voltage fluctuations that increase phase noise. In some VCOs, the LC resonant circuit may be tuned by selecting a Vin from a range of possible voltage input signals to achieve a desired $\omega_0$. In this case, fine tuning of the LC filter (i.e., of the tail harmonic filter) may be needed to compensate for changes in Vin and, particularly, to maintain the relationship of $\omega_1=2*\omega_0$. However, this fine-tuning capability typically requires additional circuitry (e.g., switched capacitors and/or inductors incorporated into or external to the LC filter) that increases both manufacturing costs and area consumption.

In view of the foregoing, disclosed herein are embodiments of a VCO including an inductor-capacitor (LC) resonant circuit including varactors connected to receive a variable input voltage (Vin) to achieve a desired oscillation frequency ($\omega_0$). The VCO can further include cross-coupled field effect transistors, which are connected to the LC resonant circuit to compensate for energy loss. The VCO can further include an LC filter, which has a resonant frequency ($\omega_1$) and which is connected to a shared source node of the cross-coupled field effect transistors. Within the VCO, the LC filter can be automatically fine-tuned in response to changes in Vin to improve phase noise. Specifically, in the disclosed embodiments, the cross-coupled field effect transistors can have back gates (e.g., due to implementation in a fully-depleted semiconductor-on-insulator technology processing platform, as discussed below). The back gates can be connected to receive a variable back gate bias voltage (Vbg) that is dependent on Vin (e.g., equal to or otherwise directly proportional to Vin) so a desired relationship (e.g., an optimal relationship) between wo of the LC resonant circuit and $\omega_1$ of the LC filter is essentially continuously maintained. The desired relationship can be, for example, $\omega_1=2*\omega_0$ (or at least $\omega_1\sim 2*\omega_0$) in order to eliminate (or at least minimize) return paths for the second harmonic ($2\omega_0$) and thereby eliminate (or at least minimize) common mode voltage fluctuations that lead to phase noise. For example, when Vin is increased to increase varactor capacitance and thereby decrease $\omega_0$, Vbg will be concurrently increased. By concurrently increasing Vbg, voltage (Vs-s) and capacitance (Cs-s) on the shared source node increase, thereby decreasing $\omega_1$ of the LC filter and maintaining the optimal relationship between $\omega_0$ and $\omega_1$. This back gate biasing of the cross-coupled transistors ensures that the LC filter is effective across the entire range of possible voltage input signals and eliminates the need to incorporate additional circuitry into the VCO (internal or external to the LC filter) to enable LC filter fine tuning. Additional advantages are discussed further within the detailed description below.

Figure 1A:
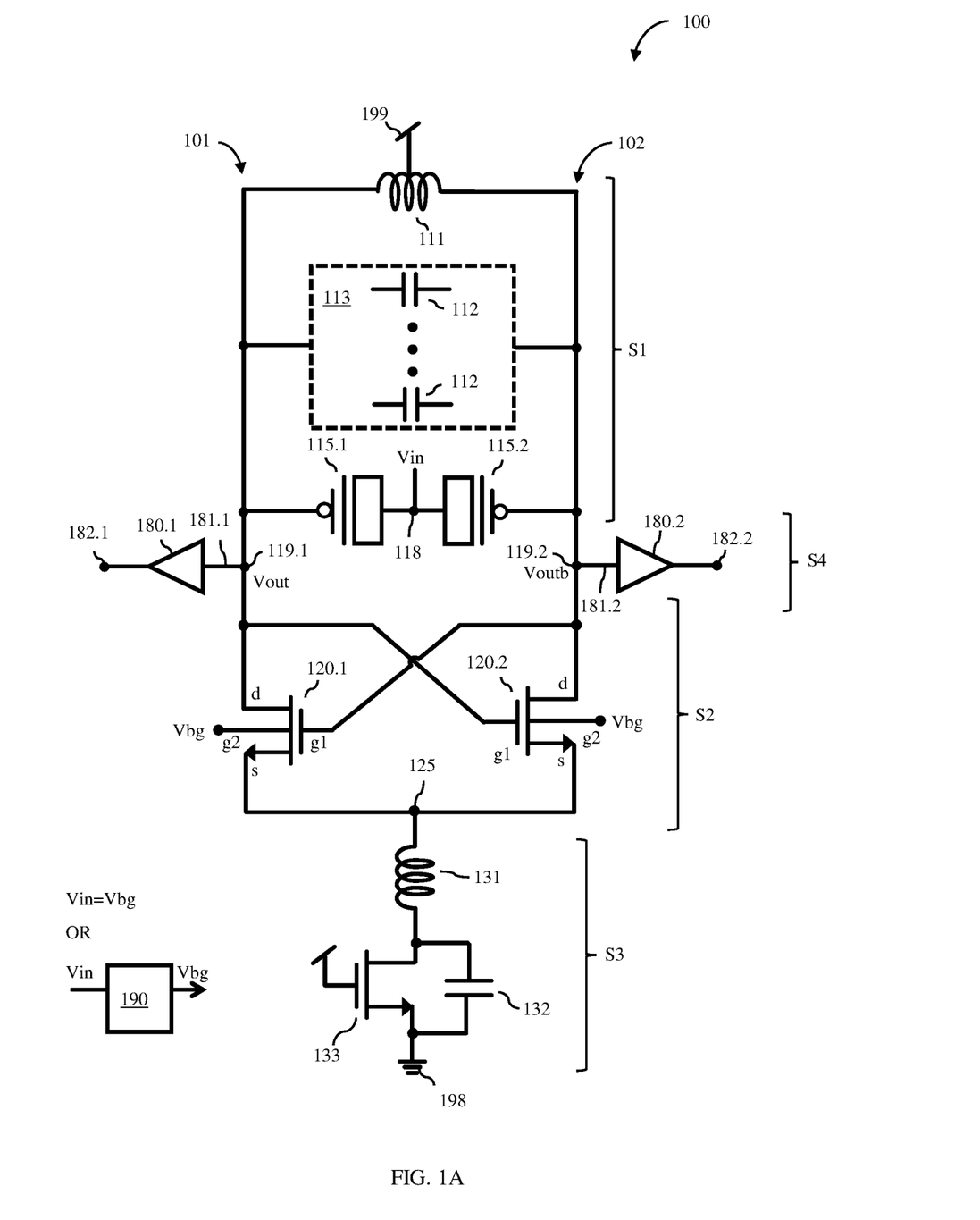
FIG. 1A is a schematic diagram illustrating a disclosed embodiment of a VCO.

More particularly, FIG. 1A is a schematic diagram illustrating an embodiment of a VCO 100. VCO 100 can include multiple stages S1-S4. The stages can include: a first stage S1 and, particularly, an LC resonant circuit (also referred to herein as an LC tank); a second stage S2 and, particularly, a pair of cross-coupled field effect transistors; a third stage S3 and, particularly, an LC filter (also referred to herein as a tail harmonic filter), and a fourth stage S4 and, particularly, an output stage.

LC resonant circuit S1 can be a parallel LC resonant circuit with inductor(s) and capacitor(s) connected in parallel. Specifically, LC resonant circuit S1 can include a first interconnect line 101 and a second interconnect line 102. LC resonant circuit S1 can further include at least one inductor 111 electrically connected between first interconnect line 101 and second interconnect line 102. Inductor 111 can further be coupled to a positive supply voltage 199 (e.g., Vdd). For purposes of illustration, only one inductor is shown in FIG. 1A; however, it should be understood that the figure is not intended to be limiting. Alternatively, LC resonant circuit S1 could include, for example, series-connected inductors between first and second interconnect lines 101-102 or any other suitable inductor configuration for an LC resonant circuit.

LC resonant circuit S1 can further include at least one capacitor connected between first interconnect line 101 and second interconnect line 102. It should be understood that any suitable capacitor configuration for an LC resonant circuit could be employed. For example, in some embodiments as illustrated, LC resonant circuit S1 can include a tunable digital capacitor array 113. Tunable digital capacitor array 113 can include multiple capacitors 112 connectable by switches to first and second interconnect lines 101-102. Tunable digital capacitor array 113 can further be configured to receive a capacitance select signal and, based on the capacitance select signal, operate the switches to selectively connect one or more of multiple capacitors 112 to first and second interconnect lines 101-102 in order to achieve a desired capacitance. Tunable digital capacitor arrays are known in the art and, thus, the details thereof have been omitted from this specification in order to allow the reader to focus on the salient aspects of the disclosed embodiments. It should be understood that such a tunable digital capacitor array can be employed to coarsely tune LC resonant circuit capacitance.

LC resonant circuit S1 can further include a pair of varactors 115.1-115.2 connected to first interconnect line 101 and second interconnect line 102, respectively. Each varactor 115.1-115.2 can further be connected to a voltage input node 118 for receiving a variable input voltage (Vin) for fine-tuning of LC resonant circuit S1.

For example, as illustrated, varactors 115.1-115.2 can be p-type metal oxide semiconductor field effect transistor varactors (PFET varactors). Each PFET varactor 115.1-115.2 can include a semiconductor layer and, within the semiconductor layer, a channel region positioned laterally between the source (s)/drain (d) regions. The s/d regions can have p-type conductivity at a relatively high conductivity level (e.g., can be p+ s/d regions) and the channel region can be intrinsic (i.e., undoped), can have n-type conductivity at a relatively low conductivity level (e.g., can be an n−channel region), or can have p-type conductivity. Each PFET varactor 115.1-115.2 can further include a front gate (g1) (also referred to herein as a control gate or a primary gate) adjacent to the channel region. The front gate can include a gate dielectric layer (including one or more layers of gate dielectric material) immediately adjacent to the top surface of semiconductor layer at the channel region and a gate conductor layer (including one or more layers of gate conductor material) on the gate dielectric layer. The front gate could be any of the following: a gate-first polysilicon gate structure (including, for example, a silicon dioxide layer and a p-doped polysilicon layer); a gate-first high-K metal gate (HKMG) structure; a gate-last HKMG structure (also referred to as a replacement metal gate (RMG) structure); or any other suitable type of gate structures. Such gate structures are well known in the art and, thus, details thereof have been omitted from the specification in order to allow the reader to focus on the salient aspects of the disclosed embodiments. Gate sidewall spacers can be positioned laterally adjacent to sidewalls of the front gates (e.g., to electrically isolate the front gates from adjacent s/d regions).

Furthermore, within each PFET varactor, the p-type s/d regions can be tied together (i.e., electrically connected to each other) and further electrically connected to voltage input node 118. Additionally, the front gate of the first PFET varactor 115.1 can be electrically connected to first interconnect line 101 and the front gate of the second PFET varactor 115.2 can be electrically connected to second interconnect line 102. With this configuration, stored energy in LC resonant circuit S1 alternates at a resonant frequency between electrical energy stored in the capacitors (e.g., in any selected capacitor(s) 112 from digital tunable capacitor array 113 and in varactors 115.1-115.2) and magnetic energy stored in the inductor(s) (e.g., in inductor 111) to generate the oscillating output signal with a particular oscillating frequency ($\omega_0$) at output stage S4. $\omega_0$ can be determined as follows:

$$\omega_0 = \frac{1}{\sqrt{LC}}, \qquad (1)$$

where L is total inductance and C is total capacitance. It should be understood that C can be coarsely tuned by selection of one or more of the capacitors 112 from an array (if available). Furthermore, C can be finely tuned by adjusting Vin (e.g., by selecting a particular Vin from a range of possible voltage input signals).

It should be noted that output stage S4 can include output terminals 119.1-119.2 on first and second interconnect lines 101-102, respectively. Oscillating output signal (Vout) and an inverted oscillating output signal (Voutb) can be generated on these output terminals 119.1-119.2. Optionally, output stage S4 can further include output buffers 180.1-180.2 having input nodes 181.1-181.2 electrically connected to output terminals 119.1-119.2 of LC resonant circuit S1 to receive Vout and Voutb, respectively, and output nodes 182.1-182.2 to output corresponding buffered oscillating output signals.

Additionally, it should be understood that energy loss within LC resonant circuit S1 is inversely proportional to the parallel resistance (Rp) (i.e., resistance in parallel with C and L) and Rp can be determined as follows:

$$R_p = \frac{w_0^2 L^2}{R_{sL}} \left\| \frac{w_0^2 L^2}{R_{sC}}, \right. \qquad (2)$$

where $R_{sL}$ is the total equivalent series resistance of the inductor(s) in LC resonant circuit S1 and where $R_{sC}$ is the total equivalent series resistance of the capacitor(s) in LC resonant circuit S1.

In order to compensate for this energy loss, VCO 100 can further include a pair of cross-coupled field effect transistors (FETs) S2. The FETs can be n-type field effect transistors (NFETs) 120.1 and 120.2 electrically connected to first and second interconnect lines 101-102, respectively (e.g., at the output terminals 119.1-119.2). Additionally, NFETs 120.1-120.2 can each have a back gate (g2) and the back gate can be biased with a variable back gate voltage (Vbg) that tracks Vin for fine-tuning of LC filter S3, as discussed in greater detail below.

Figure 1B:
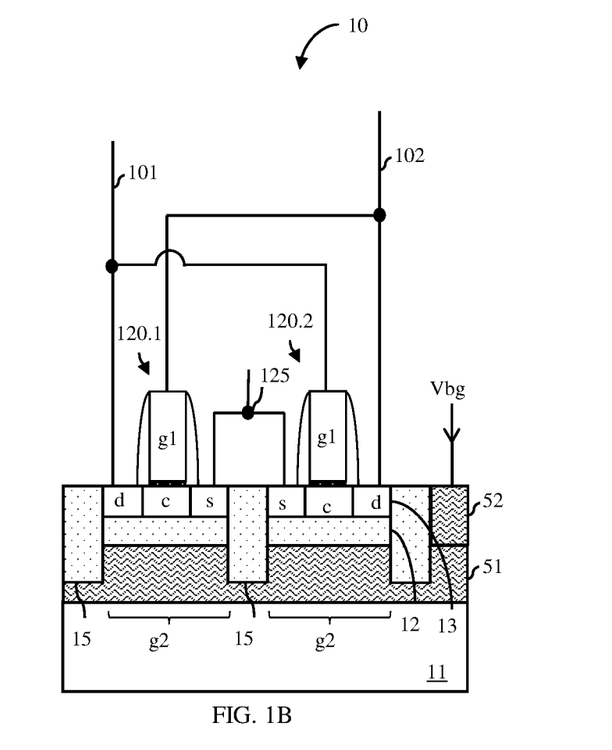
FIG. 1B is a cross-section diagram illustrating in greater detail fully-depleted semiconductor-on-insulator cross-coupled field effect transistors that can be incorporated into the VCO of FIG. 1A.

More particularly, the disclosed embodiments can be implemented in a fully-depleted semiconductor-on-insulator (e.g., a fully-depleted silicon-on-insulator (FDSOI)) technology processing platform. FIG. 1B is a cross-section diagram illustrating in greater detail a structure 10 including fully-depleted semiconductor-on-insulator (e.g., FDSOI) cross-coupled field effect transistors S2 that can be incorporated into VCO 100 of FIG. 1A. Referring to FIG. 1B in combination with FIG. 1A, structure 10 can include a semiconductor substrate 11. Semiconductor substrate 11 can be, for example, a monocrystalline silicon substrate or a substrate of any other suitable monocrystalline semiconductor material (e.g., silicon germanium, etc.). Structure 10 can further include at least one semiconductor-on-insulator region (e.g., an SOI region). The semiconductor-on-insulator region can include an insulator layer 12 on semiconductor substrate 11. Insulator layer 12 can be, for example, a thin silicon dioxide layer or a relatively thin layer of any other suitable insulator material. The semiconductor-on-insulator region can further include a thin semiconductor layer 13 on insulator layer 12. Semiconductor layer 13 can be, for example, a monocrystalline silicon layer or a layer of any other suitable monocrystalline semiconductor material (e.g., silicon germanium, etc.).

NFETs 120.1-120.2 can be within the above-described semiconductor-on-insulator region. Each NFET 120.1-120.2 can include an active device region in a corresponding portion of semiconductor layer 13. The boundaries of the corresponding portions of semiconductor layer 13 (and thereby the boundaries of the active device regions) can be defined by isolation regions 15. Isolation regions 15 can be, for example, shallow trench isolation (STI) regions. That is, trenches can extend from the top surface of semiconductor layer 13 to and optionally through insulator layer 12, can laterally surround the active device regions of the transistors, and can be filled with one or more layers of isolation materials (e.g., silicon dioxide, silicon nitride, silicon oxynitride, etc.).

Each NFET 120.1-120.2 can further include, within its active device region, a channel (c) region positioned laterally between source/drain (s/d) regions. The s/d regions can have n-type conductivity at a relatively high conductivity level (e.g., can be n+ source/drain regions) and the channel region can be either intrinsic (i.e., undoped) or can have p-type conductivity at a relatively low conductivity level (e.g., can be a p− channel region).

Each NFET 120.1-120.2 can further include a front gate (g1) (also referred to herein as a control gate or a primary gate) adjacent to (e.g., above, and immediately adjacent to) its active device region at the channel region. The front gates of NFETs 120.1-120.2 can include a gate dielectric layer (including one or more layers of gate dielectric material) immediately adjacent to the channel region and a gate conductor layer (including one or more layers of gate conductor material) on the gate dielectric layer. Such a front gate (g1) could be any of the following: a gate-first polysilicon gate structure (including, for example, a silicon dioxide layer and an n-doped polysilicon layer); a gate-first high-K metal gate (HKMG) structure; a gate-last HKMG structure (also referred to as a RMG structure); or any other suitable type of gate structures. Such gate structures are well known in the art and, thus, the details thereof have been omitted from the specification in order to allow the reader to focus on the salient aspects of the disclosed embodiments. Gate sidewall spacers can further be positioned laterally adjacent to sidewalls of the front gates (e.g., to electrically isolate the front gates from adjacent s/d regions). Optionally, the front gates of NFETs 120.1-120.2 can include different gate materials than the front gates of PFET varactors 115.1-115.2 to achieve different work functions.

As illustrated, the source regions of NFETs 120.1-120.2 can be electrically connected to a shared source node 125. This shared source node 125 can be electrically connected to ground 198 via LC filter S3. Additionally, the drain region of NFET 120.1 can be electrically connected to first interconnect line 101 (e.g., at output terminal 119.1) and the drain region of NFET 120.2 can be electrically connected to second interconnect line 102 (e.g., at output terminal 119.2). As mentioned above, NFETs 120.1-120.2 can further be cross-coupled. That is, the front gate (g1) of NFET 120.1 can be electrically connected to the drain region of NFET 120.2 and thereby to second interconnect line 102 and the front gate (g1) of NFET 120.2 can be electrically connected to the drain region of NFET 120.1 and thereby to first interconnect line 101.

As indicated by the following equations, the cross-coupled NFETs 120.1-120.2 provide negative resistance and thereby negative transconductance (Gm) to compensate for the energy loss in LC resonant circuit S1:

$$Zin = \frac{Vx}{Ix} = \frac{-2}{gm}, \text{ and} \quad (3)$$

$$\frac{V^2}{R_p}(\text{power cosummed in the } LC \text{ resonator}) \le \quad (4)$$

$$\frac{V^2}{2/gm}(\text{power provided by the cross - couple pair,}$$

$V$ is voltage amplitude at $Vout(Voutb)$) and leads to $gm \ge \frac{2}{R_p}$, where Zin refers to the input impedance at the drain region of each NFET, Vx refers to the gate voltage differential, Ix refers to the resulting current flow, gm refers to transconductance of a single transistor, and Gm refers to the total equivalent transconductance of the cross-coupled pair. It should be understood that, typically, gm of NFET 120.1 has the same value as gm of NFET 120.2. In this case, Gm=gm/2, otherwise Gm=gm1*gm2/(gm1+gm2). In the disclosed embodiments, to start up and sustain the oscillation in the LC resonator, the energy provided by the cross-coupled pair should be larger than the energy loss in the LC resonator and, thus, the absolute value of the negative transconductance Gm should be larger than the resonator transconductance Gtank, where Gtank=1/Rp. By using such cross-coupled FETs S2 to compensate for this energy loss, oscillation of the oscillating output signal can be sustained.

In addition to the features described above, each NFET 120.1-120.2 can further include a back gate (g2) (also referred to herein as a secondary gate) adjacent to (e.g., below, and immediately adjacent to) the active device region opposite the front gate (g1). Specifically, as shown in FIG. 1B, structure 10 can include a well region 51 within and at the top surface of semiconductor substrate 11 immediately adjacent insulator layer 12. Well region 51 can be aligned below the active device regions for NFETs 120.1-120.2. For purposes of this disclosure, a well region refers to a region of semiconductor material doped (e.g., via a dopant implantation process or any other suitable doping process) so as to have a particular conductivity type. A Pwell refers to a well region doped so as to have p-type conductivity, whereas an Nwell refers to a well region doped so as to have n-type conductivity. The back gate can include adjacent portions of insulator layer 12 and well region 51 below.

Those skilled in the art will recognize that one advantage of fully depleted semiconductor-on-insulator (e.g., FDSOI) technology processing platforms is that N-type transistors (e.g., NFETs) and P-type transistors (PFETs) can be formed on an insulator layer above an Nwell or a Pwell in order to achieve different types of NFETs or PFETs with different threshold voltages (VTs). For example, for super low threshold voltage (SLVT) or low threshold voltage (LVT) FETs, NFETs are formed above Nwells and PFETs are formed above Pwells. For regular threshold voltage (RVT) or high threshold voltage (HVT) FETs, NFETs are formed above Pwells and PFETs are formed above Nwells. Typically, a circuit block will include all SLVT (or LVT) FETs with NFETs above Nwells and PFETs above Pwells or all RVT (or HVT) FETs with NFETs above Pwells and PFETs above Nwells. Those skilled in the art will also recognize that whether the FETs are SLVT or LVT FETs or whether they are RVT or HVT FETs will depend upon the design (e.g., device size, etc.) and process specifications (e.g., dopant concentrations, etc.). In the disclosed embodiments, well region 51 can be either Pwell or an Nwell. If well region 51 is a Pwell, then NFETs 120.1-120.2 will be RVT (or HVT) NFETs, whereas, if well region 51 is an Nwell, then NFETs 120.1-120.2 will be SLVT (or LVT) NFETs. It should be understood that, if the well region 51 is a Pwell, then the structure 10 would further include a buried Nwell (not shown) below the Pwell so as to electrically isolate the Pwell from a lower portion of the semiconductor substrate below.

Another advantage of fully depleted semiconductor-on-insulator (e.g., FDSOI) technology processing platforms is that back gate biasing (referred to as back-biasing) can be employed. To enable back gate biasing, structure 10 can further include a bulk region (also referred to as a hybrid region). This bulk region can be devoid of the insulator layer 12 and instead can include a contact region 52 on the semiconductor substrate 11 immediately adjacent to well region 51 and electrically isolated from the active device regions of the transistors (e.g., by isolation regions 15). Contact region 52 can include, for example, an epitaxially grown monocrystalline semiconductor layer (e.g., an epitaxially grown silicon layer or an epitaxially grown layer of any other suitable semiconductor material) on the top surface of semiconductor substrate 11 immediately adjacent to well region. Contact region 52 can be doped (e.g., in situ or subsequently implanted) so as to have the same type conductivity as the well region 51, optionally at a higher conductivity level. For example, if well region 51 is a Pwell, contact region 52 can be a P+ contact region (also referred to herein as a Ptap). If well region 51 is an Nwell, contact region 52 can be an N+ contact region (also referred to herein as an Ntap). Optionally, contact region 52 can further include a silicide layer thereon (not shown).

Typically, in FDSOI, back gate biasing is employed to fine-tune the threshold voltages of FETs. For example, forward back-biasing (FBB) refers to applying a gate bias voltage to the back gate (particularly, to the well region thereof) to reduce the VT of the FET, thereby increasing the switching speed. Generally, for a PFET, FBB is achieved by applying 0 volts or a negative gate bias voltage to the well region; whereas, for an NFET, FBB is achieved by applying a positive gate bias to the well region. Reverse back-biasing (RBB) refers specifically to applying a gate bias voltage to the back gate (particularly, to the well region thereof) to increase the VT of the FET, thereby decreasing the switching speed and reducing leakage current. Generally, for a PFET, RBB is achieved by applying a positive gate bias voltage to the well region; whereas, for an NFET, RBB is achieved by applying a negative gate bias voltage to the well region.

In the disclosed embodiments, back gate biasing is employed for the novel purpose of fine-tuning LC filter S3. Specifically, the back gates (g2) of NFETs 120.1-120.2 can be biased with a variable back gate voltage (Vbg) that specifically depends on and, more particularly, that tracks Vin (e.g., increases when Vin is increased and decreases when Vin is decreased). As mentioned above, shared source node 125, which is connected to the source regions of NFETs 120.1-120.2, is further connected to ground 198 via LC filter S3. LC filter S3 (also referred to herein as a tail harmonics filter) includes at least an additional inductor 131 connected between shared source node 125 and ground. The additional inductor 131 can have a first end electrically connected to shared source node 125 and a second end opposite the first end. The second end could be connected directly to ground (not shown). Optionally, as illustrated, LC filter S3 can further include an additional capacitor 132 with a first plate connected to the second end of the additional inductor 131 and a second plate connected to ground. Optionally, as illustrated, LC filter S3 can further include an additional NFET 133 connected in parallel with additional capacitor 132 between the second end of additional inductor 131 and ground. Additional NFET 133 can further have a front gate tied to a positive supply voltage 199 (Vdd) so as to be in an always-on state. The configuration of LC filter S3 shown in the figures and described above is provided for illustration purposes and is not intended to be limiting. Alternatively, any other suitable LC filter configuration could be employed. However, it should be understood that LC filter S3 will be designed to have a resonant frequency ($\omega_1$) that is equal to or closely approximates twice the oscillating frequency ($\omega_0$) (e.g., plus or minus 10%) at some nominal Vin in order to eliminate (or at least minimize) return paths for the second harmonic ($2\omega_0$) and thereby eliminate (or at least minimize) common mode voltage fluctuations that lead to phase noise. Furthermore, fine-tuning of LC filter S3 may be required to reduce phase noise (e.g., when Vin is changed from the nominal Vin to some other Vin within a range of possible voltage input signals). In the disclosed embodiments, instead of including additional circuitry to enable such fine-tuning, fine-tuning of LC filter S3 can be accomplished by biasing the back gates (g2) of NFETs 120.1-120.2 with a variable back gate voltage (Vbg) that tracks Vin (i.e., that is dependent on Vin).

Specifically, in the disclosed embodiments, Vin controls changes in capacitances of the varactors of LC resonant circuit S1 to adjust and, particularly, fine-tune $\omega_0$. Vbg tracks Vin (e.g., increases when Vin increases and decreases when Vin decreases) to concurrently adjust the voltage (Vs-s) on shared source node 125 (e.g., through NFET conductivity) and the capacitance (Cs-s) on shared source node 125 (e.g., through Vbg-adjusted body-to-source capacitance (Cbs) and gate-to-source capacitance (Cgs)). With the configuration of LC filter S3 shown in FIG. 1A, inductance of additional inductor 131 and the capacitance of additional capacitor 132 and Cs-s (which varies with variations in Vbg) in combination suppress up converted low frequency noise to reduce phase noise. As a result, $\omega_1$ is adjusted so that the relationship between $\omega_0$ and $\omega_1$ of $\omega_1$ equals or closely approximates $2*\omega_0$ (e.g., plus or minus 10%) is continuously maintained. In this way, increases in Vin and Vbg cause increases in the capacitances of PMOS varactors 115.1-115.2 and in Cs-s, respectively, to cause corresponding decreases in $\omega_0$ and $\omega_1$, respectively. Contrarily, decreases in Vin and Vbg cause decreases in the capacitances of PMOS varactors 115.1-115.2 and in Cs-s, respectively, to cause corresponding increases in $\omega_0$ and $\omega_1$, respectively.

In some embodiments, Vbg can simply be equal to Vin. That is, Vbg and Vin can be the same voltage signal. In other embodiments, during VCO design, a bias voltage optimization process can be performed to determine the optimal Vbg for each Vin within the range of possible voltage input signals. During bias voltage optimization, a phase noise monitor can monitor phase noise in LC resonant circuit S1 across the range of possible voltage input signals. An optimal Vbg can be determined for each Vin to reduce the resulting phase noise. In this case, a bias voltage generator 190 can be designed (e.g., with a look-up table (LUT)) for incorporation into the VCO 100. The bias voltage generator 190 can receive the Vin applied to voltage input node 118 (or an indicator thereof) and can output the appropriate Vbg for that Vin in order to maintain the relationship between $\omega_0$ and $\omega_1$.

Figure 2:
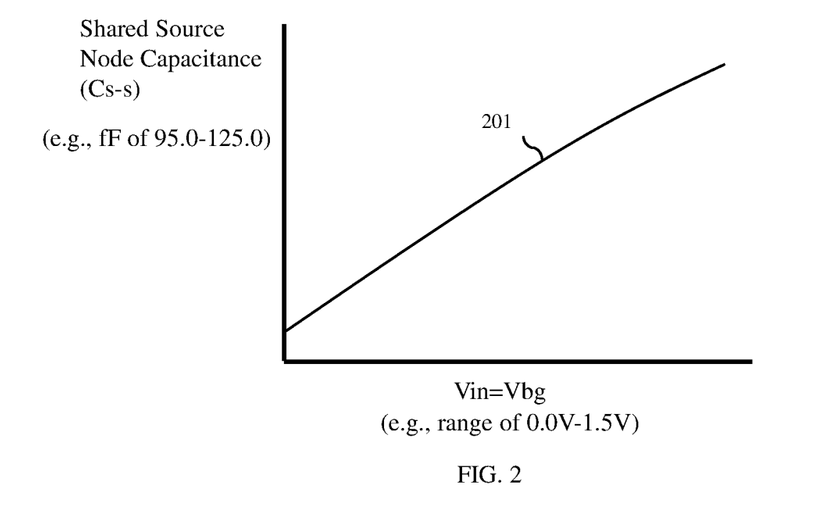
FIGS. 2-5 are graphs illustrating example performance parameters that can be exhibited by the VCO of FIG. 1A.

FIG. 2 is a graph including an example Cs-s/Vbg curve 201 for the VCO 100 of FIGS. 1A-1B. Curve 201 illustrates changes in Cs-s at the shared source node 125 corresponding to changes in Vbg. In this example, Vbg is equal to Vin, which can range from 0.0V to 1.5V.

Figure 3:
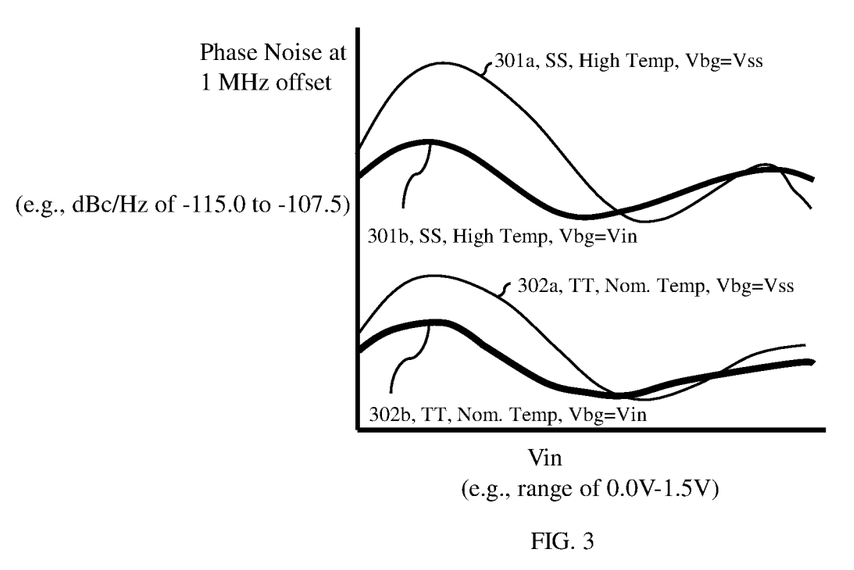

FIG. 3 is a graph including example phase noise/Vin curves 301a-301b and 302a-302b. The example phase noise/Vin curve 301a corresponds to worst case process corners (e.g., slow-slow (SS) and high temperature) when the back gates are simply connected to ground (Vss) (i.e., Vbg=Vss). The example phase noise/Vin curve 301b corresponds to the same worst case process corners (e.g., SS and high temperature) when Vbg=Vin. As illustrated, phase noise is reduced when Vbg=Vin particularly at lower voltage levels. The example phase noise/Vin curve 302a corresponds to nominal process corners (e.g., typical-typical (TT) and nominal temperature) when the back gates are simply connected to ground (Vss) (i.e., Vbg=Vss). The example phase noise/Vin curve 302b corresponds to the same nominal process corners (e.g., TT and nominal temperature) when Vbg=Vin. As illustrated, phase noise is lower than that seen with the worst case process corners and is further reduced when Vbg=Vin particularly at lower voltage levels.

Figure 4:
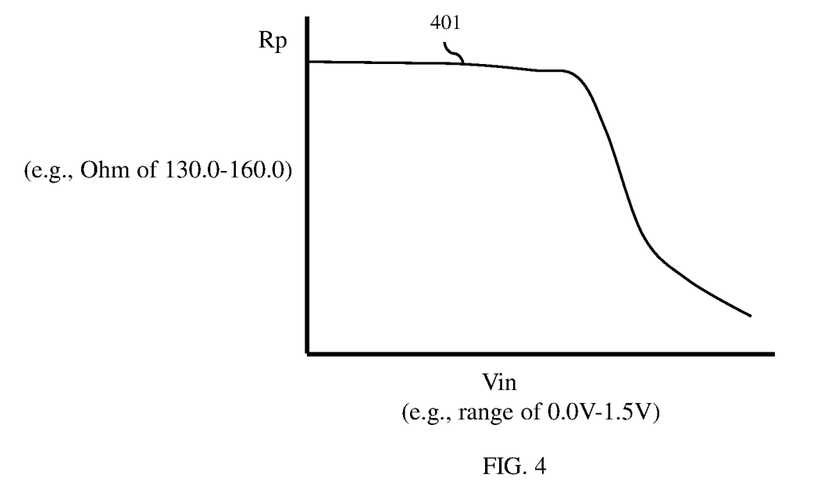

FIG. 4 is a graph including an example Rp/Vin curve 401 for the VCO 100 of FIGS. 1A-1B, where Rp refers to the parallel resistance of LC resonator S1, only determined by inductors 111, capacitor array 113, and varactors 115.1-115.2. Curve 401 illustrates changes in Rp corresponding to changes in Vin (i.e., the variable input that is applied to the voltage input node 118 which is connected to varactors 115.1-115.2). In this example, Vin can range from 0.0V to 1.5V.

Figure 5:
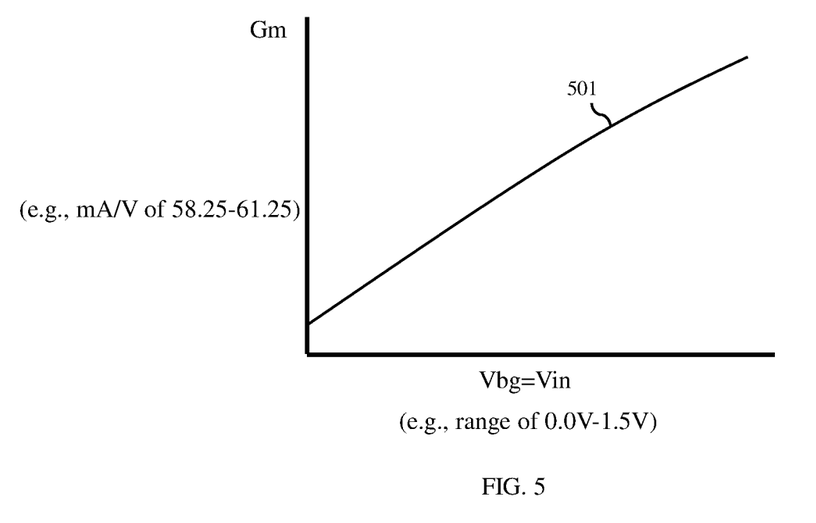

FIG. 5 is a graph including an example Gm/Vbg curve 501 for the VCO 100 of FIGS. 1A-1B. Curve 501 illustrates changes in Gm corresponding to changes in Vbg. In this example, Vbg is equal to Vin, which can range from 0.0V to 1.5V. As illustrated in FIG. 4 and FIG. 5, the decreased Rp is compensated for by increased Gm at high voltage levels when Vbg=Vin.

In each of the disclosed embodiments, the VCO can include an LC resonant circuit including varactors connected to a voltage input node, wherein the voltage input node is connected to receive a variable input voltage (Vin). The VCO can further include cross-coupled FETs connected to the LC resonant circuit. These cross-coupled field effect transistors can have a shared source node and can have back gates connected to receive a variable back gate bias voltage (Vbg) that tracks (i.e., that is dependent on) Vin. The VCO can further include an LC filter connected to the shared source node. As discussed in detail above with regard to the VCO 100 of FIGS. 1A-1B, in some embodiments, only a single pair of cross-coupled FETs is incorporated into the VCO, the cross-coupled FETs can be NFETs and the varactors of the LC resonant circuit can be PMOS varactors. However, the VCO 100 of FIGS. 1A-1B is provided for illustration purposes and is not intended to be limiting. It is anticipated that back biasing of cross-coupled FETs in VCOs with different configurations could similarly be employed in order to fine-tune one or more LC filters incorporated therein.

Figure 6:
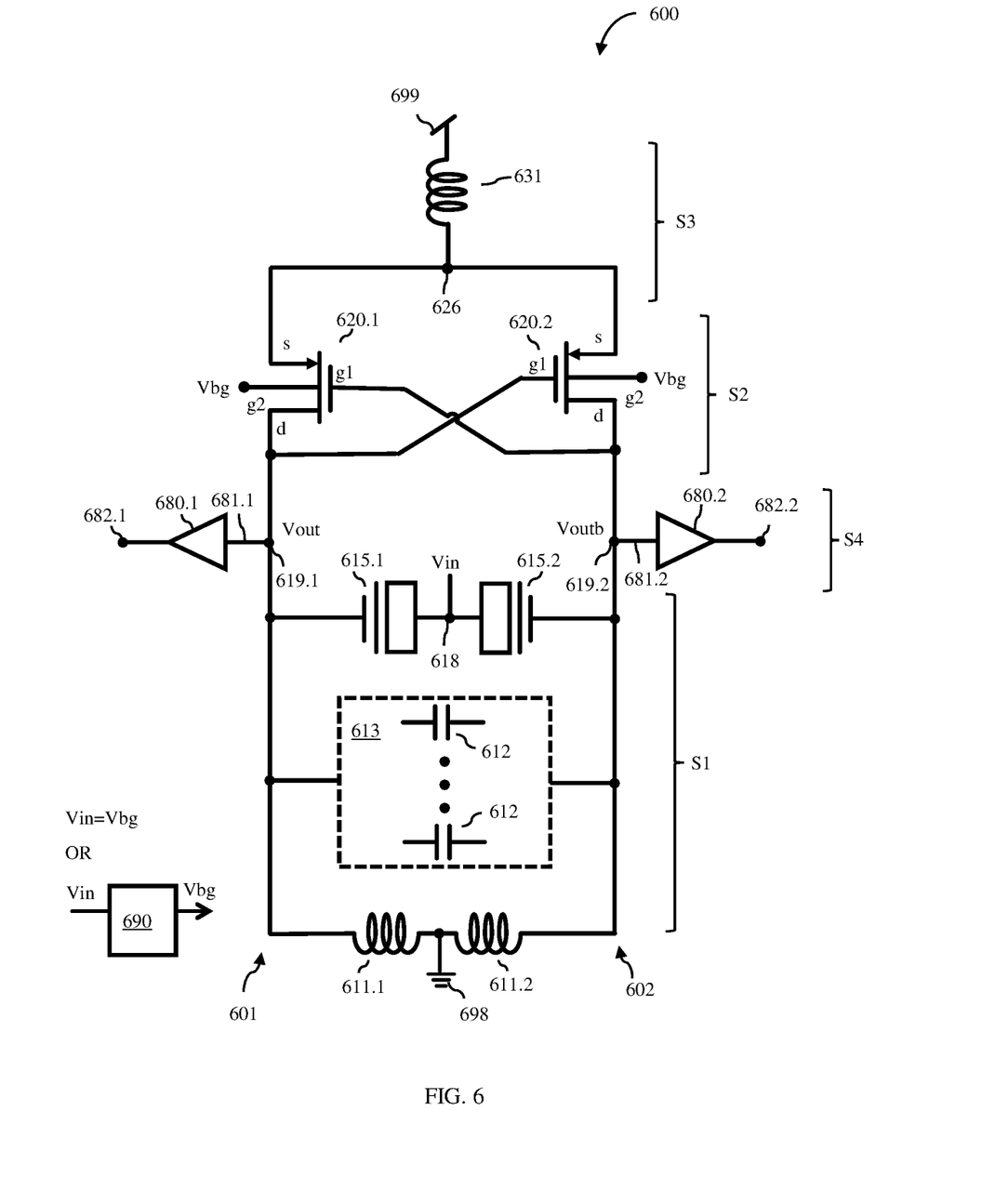
FIG. 6 is a schematic diagram illustrating another disclosed embodiment of a VCO.

FIG. 6 is a schematic diagram illustrating another embodiment of a VCO 600. VCO 600 can include multiple stages S1-S4. The stages can include: a first stage S1 and, particularly, an LC resonant circuit (also referred to herein as an LC tank); a second stage S2 and, particularly, a pair of cross-coupled field effect transistors; a third stage S3 and, particularly, an LC filter (also referred to herein as a tail harmonic filter), and a fourth stage S4 and, particularly, an output stage.

LC resonant circuit S1 can be a parallel LC resonant circuit with inductor(s) and capacitor(s) connected in parallel. Specifically, LC resonant circuit S1 can include a first interconnect line 601 and a second interconnect line 602. LC resonant circuit S1 can further include at least one inductor electrically connected between first interconnect line 601 and second interconnect line 602 (e.g., see series-connected inductors 611.1-611.2). Inductor(s) 611.1-611.2 can further be coupled to ground (e.g., Vss 698). LC resonant circuit S1 can further include at least one capacitor connected between first interconnect line 601 and second interconnect line 602. For example, LC resonant circuit S1 can include a tunable digital capacitor array 613. Tunable digital capacitor array 613 can include multiple capacitors 612 connectable by switches to first and second interconnect lines 601-602 (e.g., see discussion of tunable digital capacitor arrays above with regard to VCO 100 of FIGS. 1A-1B). LC resonant circuit S1 can further include a pair of n-type metal oxide semiconductor field effect transistor varactors (NFET varactors) 615.1-615.2. Within each NFET varactor, n-type s/d regions can be tied together (i.e., electrically connected to each other) and further electrically connected to a voltage input node 618 for receiving Vin for fine-tuning the LC resonant circuit S1. Additionally, a front gate of one NFET varactor 615.1 can be electrically connected to first interconnect line 601 and a front gate of the other NFET varactor 615.2 can be electrically connected to second interconnect line 602.

Output stage S4 can include output terminals 619.1-619.2 on first and second interconnect lines 601-602, respectively. Oscillating output signal (Vout) and an inverted oscillating output signal (Voutb) can be generated on these output terminals 619.1-619.2. Optionally, output stage S4 can further include output buffers 680.1-680.2 having input nodes 681.1-681.2 electrically connected to the output terminals 619.1-619.2 of the LC resonant circuit S1 to receive Vout and Voutb, respectively, and output nodes 682.1-682.2 to output corresponding buffered oscillating output signals.

In order to compensate for energy loss, VCO 600 can further include a pair of cross-coupled p-type field effect transistors (PFETs) 620.1 and 620.2. Source regions of PFETs 620.1-620.2 can be electrically connected to a shared source node 626. Shared source node 626 can be electrically connected to a positive supply voltage 699 (Vdd) via LC filter S3. Additionally, the drain region of PFET 620.1 can be electrically connected to first interconnect line 601 (e.g., at output terminal 619.1) and the drain region of NFET 620.2 can be electrically connected to second interconnect line 602 (e.g., at output terminal 619.2). As mentioned above, PFETs 620.1-620.2 can further be cross-coupled. That is, the front gate (g1) of PFET 620.1 can be electrically connected to the drain region of PFET 620.2 and the front gate (g1) of PFET 620.2 can be electrically connected to the drain region of PFET 620.1.

Additionally, PFETs 620.1-620.2 can each have a back gate (g2) that can be biased with a variable back gate voltage (Vbg) that tracks Vin for fine-tuning of LC filter S3. In order to achieve such back gate biasing, VCO 600 can, like VCO 100, be implemented in a fully-depleted semiconductor-on-insulator technology processing platform (e.g., an FDSOI technology processing platform). Specifically, LC filter S3 can include an additional inductor 631 electrically connected between shared source node 626 and Vdd 699. The configuration of LC filter S3 shown in FIG. 6 and described above is provided for illustration purposes and is not intended to be limiting. Alternatively, any other suitable LC filter configuration could be employed.

In any case, in VCO 600, fine-tuning of LC filter S3 can be accomplished by biasing the back gates of PFETs 620.1-620.2 with Vbg. Vbg can simply be equal to Vin. That is, they can be the same voltage signal. Alternatively, during VCO design, a bias voltage optimization process can be performed to determine the optimal Vbg for each Vin within the range of possible voltage input signals. During bias voltage optimization, a phase noise monitor can monitor phase noise in LC resonant circuit S1 across the range of possible voltage input signals. An optimal Vbg can be determined for each Vin to reduce the resulting phase noise. In this case, a bias voltage generator 690 can be designed (e.g., with a look-up table (LUT)) for incorporation into VCO 600. Bias voltage generator 690 can receive Vin applied to voltage input node 618 (or an indicator thereof) and can output the appropriate Vbg for that Vin in order to maintain the desired relationship between $\omega_0$ and $\omega_1$ and eliminate (or at least minimize) phase noise.

Figure 7:
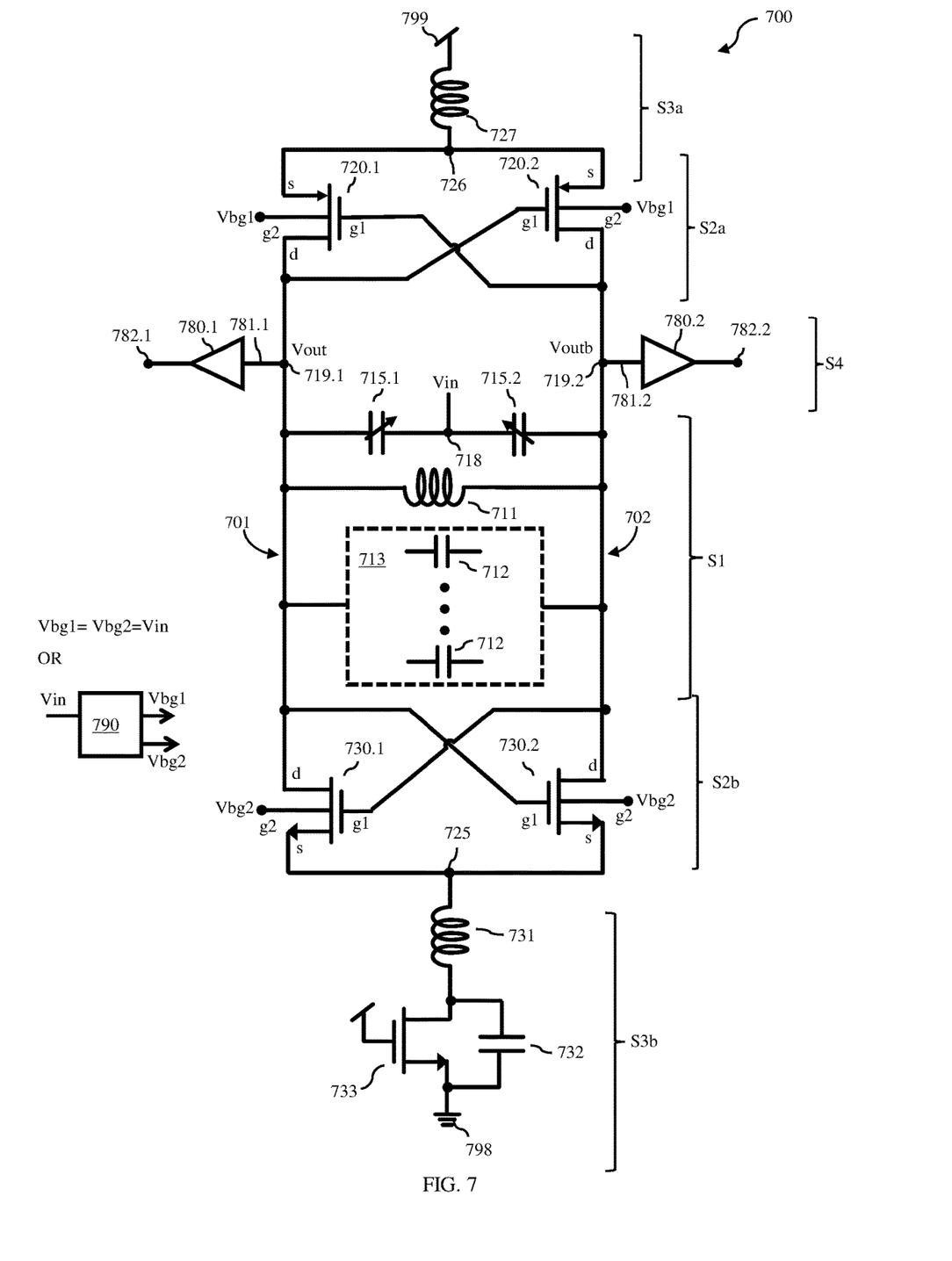
FIG. 7 is a schematic diagram illustrating yet another disclosed embodiment of a VCO.

FIG. 7 is a schematic diagram illustrating yet another embodiment of a VCO 700. VCO 700 can include multiple stages S1-S4. The stages can include: a first stage S1 and, particularly, an LC resonant circuit (also referred to herein as an LC tank); two second stages S2a and S2b and, particularly, two pairs of cross-coupled field effect transistors; two third stages S3a and S3b and, particularly, two LC filters (also referred to herein as tail harmonic filters), and a fourth stage S4 and, particularly, an output stage.

LC resonant circuit S1 can be a parallel LC resonant circuit with inductor(s) and capacitor(s) connected in parallel. Specifically, LC resonant circuit S1 can include a first interconnect line 701 and a second interconnect line 702. LC resonant circuit S1 can further include at least one inductor 711 electrically connected to first interconnect line 701 and second interconnect line 702. LC resonant circuit S1 can further include at least one capacitor connected between first interconnect line 701 and second interconnect line 702. For example, LC resonant circuit S1 could include a tunable digital capacitor array 713. Tunable digital capacitor array 713 can include multiple capacitors 712 connectable by switches to first and second interconnect lines 701-702 (e.g., see discussion of tunable digital capacitor arrays above with regard to the VCO 100 of FIGS. 1A-1B). LC resonant circuit S1 can further include a pair of varactors 715.1-715.2 connected to first interconnect line 701 and second interconnect line 702, respectively. Each varactor 715.1-715.2 can further be connected to a voltage input node 718 for receiving a variable input voltage (Vin) for fine-tuning of LC resonant circuit 51.

Output stage S4 can include output terminals 719.1-719.2 on first and second interconnect lines 701-702, respectively. Oscillating output signal (Vout) and an inverted oscillating output signal (Voutb) can be generated on these output terminals 719.1-719.2. Optionally, output stage S4 can further include output buffers 780.1-780.2 having input nodes 781.1-781.2 electrically connected to output terminals 719.1-719.2 of LC resonant circuit S1 to receive Vout and Voutb, respectively, and output nodes 782.1-782.2 to output corresponding buffered oscillating output signals.

In order to compensate for energy loss, VCO 700 can further include two pairs of cross-coupled field effect transistors S2a, S2b. Specifically, VCO 700 can include a pair of cross-coupled PFETs 720.1-720.1 that are electrically connected to first and second interconnect lines 701-702 at one end and a pair of cross-coupled NFETs 730.1-730.2 that are also electrically connected to first and second interconnect lines 701-702 at the opposite end. Specifically, source regions of PFETs 720.1-720.2 can be electrically connected to a first shared source node 726. This first shared source node 726 can be electrically connected to a positive supply voltage 799 (Vdd) via first LC filter S3a. Additionally, the drain region of PFET 720.1 can be electrically connected to first interconnect line 701 and the drain region of PFET 720.2 can be electrically connected to second interconnect line 702 (e.g., at the output terminal 719.2). As mentioned above, PFETs 720.1-720.2 can further be cross-coupled. That is, the front gate (g1) of PFET 720.1 can be electrically connected to the drain region of PFET 720.2 and the front gate (g1) of PFET 720.2 can be electrically connected to the drain region of PFET 720.1. Similarly, source regions of NFETs 730.1-730.2 can be electrically connected to a second shared source node 725. Second shared source node 725 can be electrically connected to ground (e.g., Vss 798) via second LC filter S3b. Additionally, the drain region of NFET 730.1 can be electrically connected to first interconnect line 701 and the drain region of NFET 730.2 can be electrically connected to second interconnect line 702. As mentioned above, NFETs 730.1-730.2 can further be cross-coupled. That is, the front gate (g1) of NFET 730.1 can be electrically connected to the drain region of NFET 730.2 and the front gate (g1) of NFET 730.2 can be electrically connected to the drain region of NFET 730.1.

Additionally, each of PFETs 720.1-720.2 can have a back gate (g2) that can be biased with a variable first back gate voltage (Vbg1) that tracks Vin for fine-tuning of LC filter S3a. Similarly, each of NFETs 730.1-730.2 can have a back gate (g2) that can be biased with a variable second back gate voltage (Vbg2) that tracks Vin for fine-tuning of LC filter S3b. In order to achieve such back gate biasing. VCO 700 can, like VCO 100, be implemented in a fully-depleted semiconductor-on-insulator technology processing platform (e.g., an FDSOI technology processing platform). Specifically, first LC filter S3a can include a first additional inductor 727 electrically connected between first shared source node 726 and Vdd 799. Second LC filter S3b can include at least a second additional inductor 731 connected between second shared source node 725 and ground (e.g., Vss 798). Second additional inductor 731 can have a first end electrically connected to second shared source node 725 and a second end opposite the first end. The second end could be connected directly to ground (not shown). Optionally, as illustrated, second LC filter S3b can further include an additional capacitor 732 with a first plate connected to the second end of second additional inductor 731 and a second plate connected to ground. Optionally, as illustrated, second LC filter S3b can further include an additional NFET 733 connected in parallel with additional capacitor 732 between the second end of the second additional inductor 731 and ground. Additional NFET 733 can further have a front gate tied to a positive supply voltage (e.g., Vdd 799) so as to be in an always-on state. The configuration of LC filters S3a-S3b shown in the figures and described above are provided for illustration purposes and are not intended to be limiting. Alternatively, any other suitable LC filter configurations could be employed.

In any case, in VCO 700, fine-tuning of first and second LC filters S3a-S3b can be accomplished by biasing the back gates of PFETs 720.1-720.2 with Vbg1 and biasing the back gates of NFETs 730.1-730.1 with Vbg2. Vbg1 and Vbg2 can simply be equal to Vin. That is, Vin, Vbg1, and Vbg2 can all be the same voltage signal. Alternatively, during VCO design, a bias voltage optimization process can be performed to determine the optimal Vbg1 and/or Vbg2 for each Vin within the range of possible voltage input signals. During bias voltage optimization, a phase noise monitor can monitor phase noise in LC resonant circuit S1 across the range of possible voltage input signals. An optimal Vbg1 and/or an optimal Vbg2 can be determined for each Vin to reduce the resulting phase noise. In this case, a bias voltage generator 790 can be designed (e.g., with a look-up table (LUT)) for incorporation into the VCO 700. Bias voltage generator 790 can receive the Vin applied to the voltage input node 718 (or an indicator thereof) and can output the appropriate Vbg1 and/or Vbg2 for that Vin in order to maintain the desired relationship between $\omega_0$ and $\omega_1$ and eliminate (or at least minimize) phase noise. Thus, in some embodiments, bias voltage generator 790 outputs both an optimized Vbg1 and an optimized Vbg2, as illustrated. However, in other embodiments, Vbg1=Vin and bias voltage generator 790 only outputs an optimized Vbg2 or Vbg2=Vin and bias voltage generator 790 only outputs an optimized Vbg1.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   an inductor-capacitor resonant circuit including varactors connected to a voltage input node, wherein the voltage input node is connected to receive a variable input voltage;
   cross-coupled field effect transistors connected to the inductor-capacitor resonant circuit, wherein the cross-coupled field effect transistors have a shared source node and further have back gates connected to receive a variable back gate bias voltage dependent on the variable input voltage; and
   an inductor-capacitor filter connected to the shared source node.

2. The structure of claim 1,
   wherein the variable input voltage adjusts capacitances of the varactors and thereby an oscillating frequency of the inductor-capacitor resonant circuit, and
   wherein the variable back gate bias voltage adjusts capacitance on the shared source node and thereby a resonant frequency of the inductor-capacitor filter so a relationship between the oscillating frequency and the resonant frequency is maintained.

3. The structure of claim 2, wherein the resonant frequency is twice the oscillating frequency.

4. The structure of claim 2,
   wherein increases in the variable input voltage and in the variable back gate bias voltage cause increase in the capacitances of the varactors and the capacitance on the shared source node, respectively, to cause decreases in the oscillating frequency and in the resonant frequency, and
   wherein decreases in the variable input voltage and in the variable back gate bias voltage cause decreases in the capacitances of the varactors and the capacitance on the shared source node, respectively, to cause increases in the oscillating frequency and in the resonant frequency.

5. The structure of claim 1,
   wherein the inductor-capacitor resonant circuit includes:
      a first interconnect line;
      a second interconnect line;
      an inductor connected between the first interconnect line and the second interconnect line;
      at least one capacitor connected between the first interconnect line and the second interconnect line; and
      the varactors, and
   wherein the varactors include two p-type metal oxide semiconductor field effect transistor varactors having front gates connected to the first interconnect line and the second interconnect line, respectively, and further having p-type source/drain regions connected to the voltage input node.

6. The structure of claim 5, wherein the at least one capacitor includes a tunable digital capacitor array.

7. The structure of claim 5, further comprising: output buffers connected to the first interconnect line and the second interconnect line.

8. The structure of claim 1, wherein the cross-coupled field effect transistors include cross-coupled n-type field effect transistors.

9. The structure of claim 1, wherein the variable back gate bias voltage is equal to the variable input voltage.

10. The structure of claim 1, further comprising a bias voltage generator, wherein the bias voltage generator receives the variable input voltage and based on the variable input voltage, outputs the variable back gate bias voltage.

11. The structure of claim 1, wherein the inductor-capacitor filter includes at least an additional inductor connected between the shared source node and ground.

12. A structure comprising:
an inductor-capacitor resonant circuit including varactors connected to a voltage input node, wherein the varactors including two n-type metal oxide semiconductor field effect transistor varactors and wherein the voltage input node is connected to receive a variable input voltage;
cross-coupled p-type field effect transistors connected to the inductor-capacitor resonant circuit, wherein the cross-coupled p-type field effect transistors have a shared source node and further have back gates connected to receive a variable back gate bias voltage dependent on the variable input voltage; and
an inductor-capacitor filter connected to the shared source node.

13. The structure of claim 12,
wherein the variable input voltage adjusts capacitances of the varactors and thereby adjusts an oscillating frequency of the inductor-capacitor resonant circuit, and
wherein the variable back gate bias voltage adjusts capacitance on the shared source node and thereby adjusts a resonant frequency of the inductor-capacitor filter so a relationship between the oscillating frequency and the resonant frequency is maintained.

14. The structure of claim 12,
wherein the inductor-capacitor resonant circuit includes:
 a first interconnect line;
 a second interconnect line;
 at least one inductor connected to ground and further connected between the first interconnect line and the second interconnect line; and
 at least one capacitor connected between the first interconnect line and the second interconnect line; and
 the two n-type metal oxide semiconductor field effect transistor varactors, and wherein the two n-type metal oxide semiconductor field effect transistor varactors have front gates connected to the first interconnect line and the second interconnect line, respectively, and further have n-type source/drain regions connected to the voltage input node.

15. The structure of claim 14, wherein the variable input voltage is equal to the variable back gate bias voltage.

16. The structure of claim 14, further comprising a bias voltage generator, wherein the bias voltage generator receives the variable input voltage and based on the variable input voltage, outputs the variable back gate bias voltage.

17. A structure comprising:
an inductor-capacitor resonant circuit including varactors connected to a voltage input node, wherein the voltage input node is connected to receive a variable input voltage;
cross-coupled p-type field effect transistors connected to the inductor-capacitor resonant circuit, wherein the cross-coupled p-type field effect transistors have a first shared source node and further have first back gates connected to receive a variable first back gate bias voltage dependent on the variable input voltage;
a first inductor-capacitor filter connected between the first shared source node and a positive supply voltage;
cross-coupled n-type field effect transistors connected to the inductor-capacitor resonant circuit, wherein the cross-coupled n-type field effect transistors have a second shared source node and further have second back gates connected to receive a variable second back gate bias voltage dependent on the variable input voltage; and
a second inductor-capacitor filter connected between the second shared source node and ground.

18. The structure of claim 17,
wherein the variable input voltage controls adjusts capacitances of the varactors and thereby adjusts an oscillating frequency of the inductor-capacitor resonant circuit,
wherein the variable first back gate bias voltage adjusts capacitance on the first shared source node and thereby adjusts a first resonant frequency of the first inductor-capacitor filter so a relationship between the oscillating frequency and the first resonant frequency is maintained, and
wherein the variable second back gate bias voltage adjusts capacitance on the second shared source node and thereby adjusts a second resonant frequency of the second inductor-capacitor filter so a relationship between the oscillating frequency and the second resonant frequency is maintained.

19. The structure of claim 17,
wherein the inductor-capacitor resonant circuit includes:
 a first interconnect line;
 a second interconnect line;
 an inductor connected between the first interconnect line and the second interconnect line;
 at least one capacitor connected between the first interconnect line and the second interconnect line; and
 the varactors, and
wherein the varactors include a first varactor connected to the first interconnect line and the voltage input node and a second varactor connected to the second interconnect line and the voltage input node.

20. The structure of claim 17, further comprising a bias voltage generator, wherein the bias voltage generator receives the variable input voltage and based on the variable input voltage, outputs the variable first back gate bias voltage and the variable second back gate bias voltage.

\* \* \* \* \*